US011025219B2

(12) United States Patent
Concord

(10) Patent No.: US 11,025,219 B2
(45) Date of Patent: Jun. 1, 2021

(54) COMMON-MODE FILTER

(71) Applicant: STMicroelectronics (Tours) SAS, Tours (FR)

(72) Inventor: Joel Concord, Tours (FR)

(73) Assignee: STMicroelectronics (Tours) SAS, Tours (FR)

( * ) Notice: Subject to any disclaimer, the term of this patent is extended or adjusted under 35 U.S.C. 154(b) by 18 days.

(21) Appl. No.: 16/258,883

(22) Filed: Jan. 28, 2019

(65) Prior Publication Data

US 2019/0238110 A1    Aug. 1, 2019

(30) Foreign Application Priority Data

Jan. 29, 2018   (FR) ...................... 1850707

(51) Int. Cl.
| | |
|---|---|
| H03H 7/42 | (2006.01) |
| H03H 7/01 | (2006.01) |
| H03H 7/09 | (2006.01) |
| H01P 1/20 | (2006.01) |
| H01P 1/203 | (2006.01) |
| H03H 1/00 | (2006.01) |

(52) U.S. Cl.
CPC ............ *H03H 7/427* (2013.01); *H01P 1/203* (2013.01); *H01P 1/2007* (2013.01); *H01P 1/2039* (2013.01); *H01P 1/20381* (2013.01); *H03H 7/09* (2013.01); *H03H 7/17* (2013.01); *H03H 1/0007* (2013.01)

(58) Field of Classification Search
CPC ....... H03H 7/09; H03H 7/0115; H03H 1/0007
USPC ................................................ 333/181, 185
See application file for complete search history.

(56) References Cited

U.S. PATENT DOCUMENTS

| | | | |
|---|---|---|---|
| 8,525,617 B2 | 9/2013 | Concord | |
| 9,373,438 B1* | 6/2016 | Ikriannikov | ........ H02M 3/1584 |
| 2007/0188265 A1* | 8/2007 | Perreault | ................ H03H 7/427 |
| | | | 333/181 |
| 2012/0127049 A1 | 5/2012 | Kato | |
| 2012/0274431 A1 | 11/2012 | Kato et al. | |
| 2014/0145796 A1 | 5/2014 | Okumura et al. | |

(Continued)

FOREIGN PATENT DOCUMENTS

| | | |
|---|---|---|
| EP | 2249431 A1 | 11/2010 |
| FR | 2901929 A1 | 12/2007 |
| JP | 2012195332 A * | 10/2012 |

OTHER PUBLICATIONS

English translation of JP-2012195332-A (Year: 2012).*
INPI Search Report and Written Opinion for FR 1850707 dated Oct. 16, 2018 (7 pages).

Primary Examiner — Rakesh B Patel
(74) Attorney, Agent, or Firm — Crowe & Dunlevy

(57) ABSTRACT

A filtering circuit includes at least two common-mode filters that are electrically coupled in series and magnetically coupled. The first common-mode filter includes first and second spiral inductors that are positively magnetically coupled and electrically isolated from each other. The second common-mode filter includes third and fourth spiral inductors that are positively magnetically coupled and electrically isolated from each other. The first and third spiral inductors are electrically connected in series and negatively magnetically coupled. Likewise, the second and fourth spiral inductors are electrically connected in series and negatively magnetically coupled.

34 Claims, 4 Drawing Sheets

(56) References Cited

U.S. PATENT DOCUMENTS

| | | | |
|---|---|---|---|
| 2015/0162744 A1* | 6/2015 | Liu | H01L 24/05 |
| | | | 361/111 |
| 2015/0214915 A1* | 7/2015 | Yosui | H03H 7/1725 |
| | | | 333/181 |
| 2016/0276999 A1* | 9/2016 | Sim | H01F 27/2823 |

* cited by examiner

COMMON-MODE FILTER

PRIORITY CLAIM

This application claims the priority benefit of French Application for Patent No. 1850707, filed on Jan. 29, 2018, the content of which is hereby incorporated by reference in its entirety to the maximum extent allowable by law.

TECHNICAL FIELD

The present description generally relates to electronic circuits, and more specifically to common-mode filters (CMF).

BACKGROUND

A common-mode filter is a device inserted on a transmission line of differential signals and is used to filter out disturbances having the same sign on both conductors of the transmission line.

Examples of common-mode filters are disclosed in U.S. Pat. No. 8,525,617 (incorporated by reference, see also: EP 2246931, CN 101877573, FR 2945154).

SUMMARY

An embodiment overcomes all or part of the drawbacks of usual common-mode filters.

An embodiment provides a multi-band common-mode filter.

An embodiment provides a circuit comprising at least two common-mode filters electrically in series and magnetically coupled.

According to an embodiment, the magnetic coupling between two electrically neighboring common-mode filters is negative.

According to an embodiment, each filter comprises two inductive elements magnetically coupled.

According to an embodiment, the magnetic coupling between the inductive elements of the same filter is positive.

According to an embodiment: a first track comprises at least one first inductive element and one second inductive element, electrically in series and magnetically coupled; and a second track comprises at least one third inductive element and one fourth inductive element, electrically in series and magnetically coupled, the first inductive element and the third inductive element being electrically insulated one from each other and magnetically coupled one to each other; and the second inductive element and the fourth inductive element being electrically insulated one from each other and magnetically coupled one to each other.

According to an embodiment, the respective phase points of all inductive elements are oriented on the same side.

According to an embodiment, the first inductive element and the third inductive element have approximately the same inductance value.

According to an embodiment, the second inductive element and the fourth inductive element have approximately the same inductance value.

According to an embodiment, the inductive elements are made of planar conductive windings.

According to an embodiment, the conductive windings electrically in series are concentric and in the same plane.

According to an embodiment, the conductive windings electrically in series are concentric and in two overlapping planes.

According to an embodiment, the rotation direction of the conductive windings of a given plane are inverted from one winding to the neighboring winding.

According to an embodiment, a first conductive winding and a third conductive winding, respectively forming the first inductive element and the third inductive element, are made in conductive levels stacked with at least one insulating level.

According to an embodiment, the first conductive winding and the third conductive winding are vertically aligned one to the other.

According to an embodiment, a second conductive winding and a fourth conductive winding, respectively forming the second inductive element and the fourth inductive element, are vertically aligned one to the other.

According to an embodiment, input terminals and/or output terminals are connected to diodes intended to be grounded

BRIEF DESCRIPTION OF THE DRAWINGS

These characteristics and advantages, as well as others, will be discussed in detail in the following non-limiting description of specific embodiments in connection with the accompanying drawings, among which.

DETAILED DESCRIPTION

Figure 1:
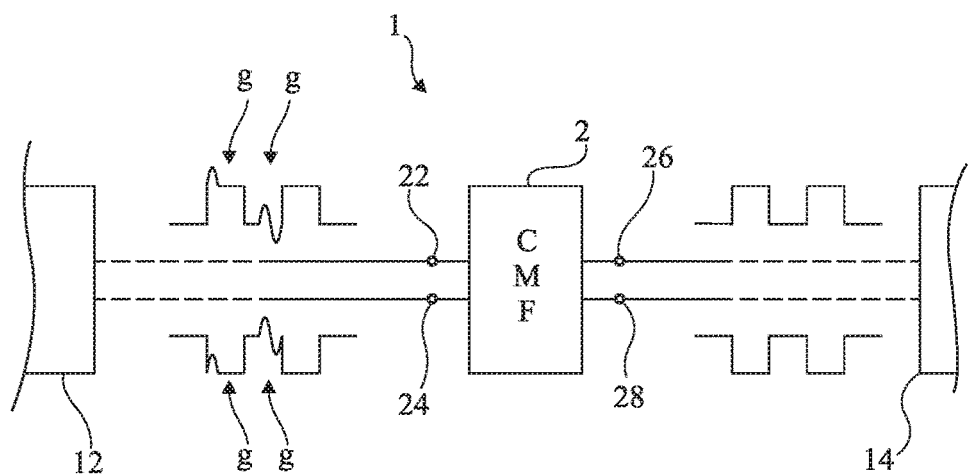
FIG. 1 shows, very schematically, an example of an electronic system of the type to which the described embodiments apply.

The same elements have been designated with the same reference numerals in the different drawings. In particular, structural and/or functional elements common to the different embodiments may have the same references and may have identical structural, dimensional and material properties.

For clarity, only those elements which are useful to the understanding of the described embodiments have been shown and will be described. In particular, circuits connected upstream or downstream of a common-mode filter have not been detailed, the described embodiments being compatible with usual applications and circuits.

Unless specified otherwise, term "connected" designates a direct connection between two elements, while terms "coupled" (electrically) and "linked" designate a connection between two elements which may be direct or via one or a plurality of other elements.

Unless otherwise specified, when reference is made to two connected elements, it means directly connected without any intermediate element other than conductors, and when reference is made to two coupled elements, this means that these two elements can be directly connected (connected) or connected through one or more other elements.

In the following description, when reference is made to terms "approximately", "about", and "in the order of", this means to within 10%, preferably to within 5%.

FIG. 1 shows, very schematically, an example of an electronic system of the type to which the described embodiments apply.

FIG. 1 is a block diagram of an electronic board 1 comprising, in addition to one or several circuits 12 capable of providing differential signals and to one or several circuits 14 capable of receiving differential signals, at least one common mode filter 2 (CMF) of the type to which the described embodiments apply.

Such a common-mode filter 2 comprises two input terminals 22 and 24 and two output terminals 26 and 28. The input terminals are intended to receive the differential signals to be processed, the filtered result of which is output.

As illustrated by the examples of signal curves in FIG. 1, the function of a common-mode filter is to let through the differential signals which are in phase opposition and to attenuate or cut the common-mode signals and noise g which are in phase on the two inputs. An ideal common-mode filter is a short circuit for signals in phase opposition at the input and an open circuit for signals in phase. In practice, the filter always lets through low frequencies, and thus a bias level common to the two differential signals. The function of a common-mode filter is thus that of a notch filter.

Common-mode filters are generally used for differential data accesses in digital processing circuits, especially if the frequency of the useful signals is in the same range as the frequency of the common-mode noise or signals which are desired to be rejected.

Common-mode filters can also be found in analog circuits, for example, to process signals in differential microphones, where the signal is transmitted symmetrically.

Figure 2:
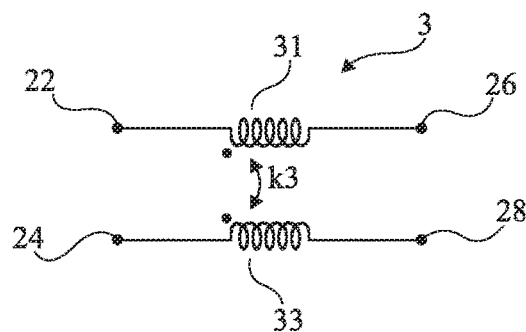
FIG. 2 shows an example of a usual common-mode filter.

FIG. 2 shows an example of a usual common-mode filter.

Such a filter 3 is formed of two inductors 31 and 33 respectively connecting input and output access nodes 22 and 26 and input and output access nodes 24 and 28. Inductors 31 and 33 are magnetically coupled (arrow k3). The respective phase points of inductors 31 and 33 are on the same side (on the side of input terminals 22 and 24) to avoid filtering signals in phase opposition. The coupling coefficient is positive, and the inductive windings are travelled by currents in the same direction. The operating principle of the filter 3 of FIG. 2 is to exhibit a high series impedance for signals in phase and a low series impedance for signals in phase opposition.

Figure 3:
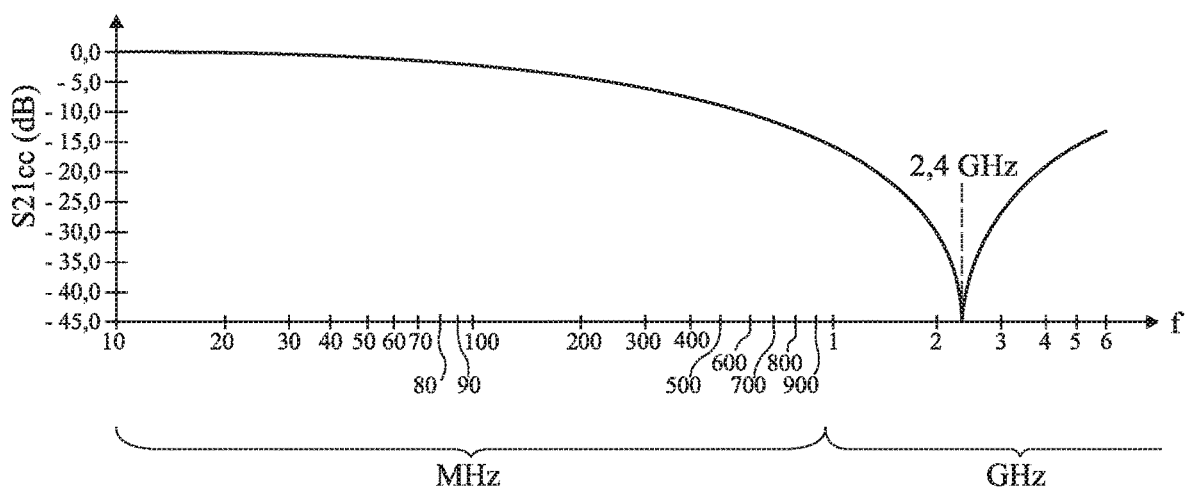
FIG. 3 is a graphic showing an example of the common mode gain, versus frequency, of a common-mode filter according to the structure of FIG. 2.

FIG. 3 is a graphic showing an example of common-mode gain, versus frequency, of a common-mode filter according to the structure of FIG. 2

More precisely, FIG. 3 shows the common mode gain (parameter S21$cc$) in dB, as a function of the frequency f in Hz, of an embodiment in which the inductive elements are made of planar windings in superposed (stacked) conductive levels. The representation of FIG. 3 is, in frequency, in logarithmic scale from 10 MHz to 6 GHz. In the example shown in FIG. 3, we assume a filter sized to filter (reject) the frequency band around a central frequency (common mode resonance frequency) of approximately 2.4 GHz. The rejection around the frequency for which the filter is sized is generally satisfactory (gain of −30 dB between approximately 2 and approximately 2.8 GHz) with a maximum attenuation peak of less than −30 dB.

However, such a common-mode filter is single-band. Increasingly, electronic circuits, in particular radio-frequency transmission/reception chains, are processing signals at different frequency bands. A filter of the type shown in FIG. 3 is not capable of eliminating noise from a frequency band different from that for which it is sized.

An example of application concerns frequency bands, respectively centered on frequencies of approximately 2.4 GHz and approximately 5.1 GHz, corresponding to the frequency bands of WiFi. As shown in FIG. 3, the rejection around 5.1 GHz is less than −15 dB (gain greater than −15 DB), which is not enough.

According to the described embodiments, it is planned to connect, in series, several common-mode filters with different common mode resonance frequencies, and the respective windings of the filters are magnetically coupled from one filter to the next filter in the association in series.

One could have thought of connecting in series two common-mode filters, respectively centered on the two frequencies (e.g. 2.4 GHz and 5.1 GHz) to be rejected, spacing them sufficiently so that they were not magnetically coupled. However, the resulting space required for these two filters would be inconsistent with the usual constraints generally imposed, in terms of surface, for this type of circuits.

In the described embodiments, the coupling between the two elementary filters (between the windings in series) is preferably negative, to lower the common mode resonance of the first elementary filter around 2.4 GHz while preserving the frequency of the second common mode resonance around 5.1 GHz of the second elementary filter.

Providing a positive coupling between the elementary filters is also possible but has the consequence of associating the two elementary filters into a single global filter, whose frequency response would be closer to that of a single filter, with a lower main resonance frequency (<2 GHz) than with a negative coupling, and a second resonance rejected at a higher frequency (>6 GHz) and with a lower attenuation.

In an embodiment having more than two common-mode filters in series, both types of coupling can be combined, but a negative magnetic coupling between two immediately neighboring (successive) filters electrically in series is preferred.

Figure 4:
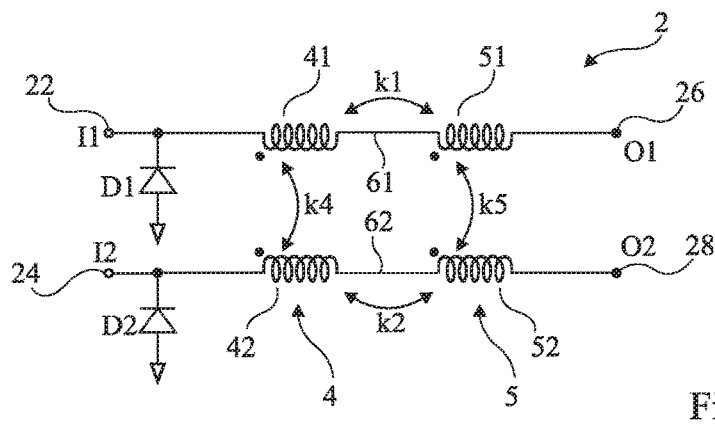
FIG. 4 shows, very schematically, an embodiment of a common-mode filter.

FIG. 4 shows, very schematically, an embodiment of a circuit 2 for common-mode filtering with two elementary common mode filters 4 and 5.

The circuit or filter 2 has two input terminals 22 and 24 (for input signals I1 and I2) and two output terminals 26 and 28 (for output signals O1 and O2).

A first elementary filter 4 has two inductive elements 41 and 42, electrically isolated from each other and magnetically coupled to each other (arrow k4). The magnetic coupling between elements 41 and 42 is positive (the planar windings of elements 41 and 42 rotate, from inside to outside, in the same direction). The respective phase points of the inductive windings constituting elements 41 and 42 are therefore on the same side. In the example shown in FIG. 4, the ends of the inductive windings 41 and 42 defining the phase points are preferably connected to the respective input terminals 22 and 24. The inductive elements 41 and 42 have preferably the same value while neglecting the manufacturing dispersions.

A second elementary filter 5 has two inductive elements 51 and 52 electrically isolated from each other and magnetically coupled to each other (arrow k5). The magnetic coupling between elements 51 and 52 is also positive (the planar windings of elements 51 and 52 rotate, from inside to outside, in the same direction). The respective phase points of the inductive windings constituting elements 51 and 52 are therefore on the same side. The inductive elements 51 and 52 have preferably the same value while neglecting the manufacturing dispersions.

The inductive elements 41 and 51 are electrically connected in series. The inductive elements 42 and 52 are electrically connected in series.

The elements electrically connected in series are magnetically coupled to each other (arrow k1 between elements 41 and 51 and arrow k2 between elements 42 and 52) with, preferably, a negative coupling coefficient. Therefore, the planar windings of elements 41 and 51, respectively 42 and 52, rotate in opposite directions from inside to outside. The respective phase points of windings 51 and 52 are on the side of their respective interconnections 61 and 62 with the windings 41 and 42. The other ends of the windings 51 and 52 (opposite to the phase points) are coupled, preferably connected, to the respective output terminals 26 and 28.

FIG. 4 shows the (optional) case where the filter 2 comprises protective circuits against electrostatic discharges (ESD). For example, a diode D1 connects terminal 22 to ground (the anode of diode D1 being grounded) and a diode D2 connects terminal 24 to ground (the anode of diode D1 being grounded). Such protection circuits against electrostatic discharges can be provided at inputs 22 and 24 and at outputs 26 and 28.

It should be noted that the filter 2 is bidirectional, i.e. the designation of inputs and outputs depends on the assembly of the filter in its applicative environment and can be changed, provided that, in the presence of ESD protection circuits, these circuits are provided on both sides of the filter.

Figure 5:
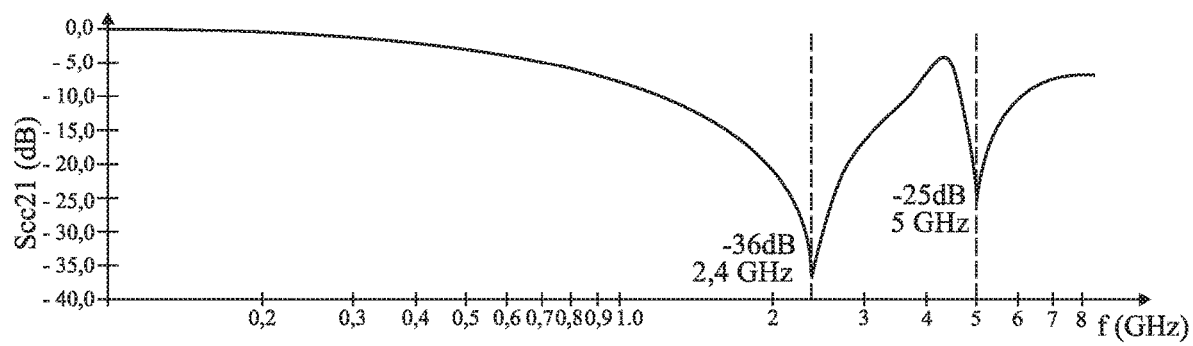
FIG. 5 is a graphic showing an example of the common mode gain, versus frequency, of a common-mode filter according to the structure of FIG. 4.

FIG. 5 is a graphic showing an example of the common mode gain, versus frequency, of a common-mode filter according to the structure of FIG. 4.

Figure 6:
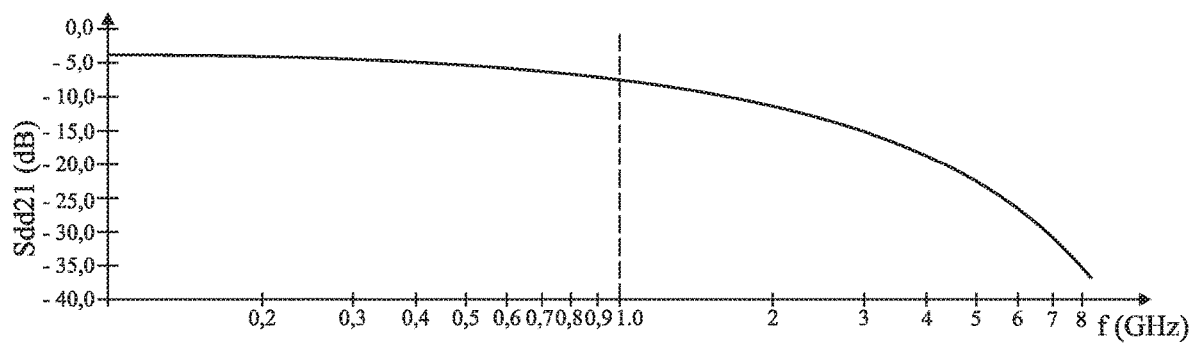
FIG. 6 is a graphic showing an example of the differential mode gain, versus frequency, of a common-mode filter according to the structure of FIG. 4.

FIG. 6 is a graphic showing an example of the differential mode gain, versus frequency, of a common-mode filter according to the structure of FIG. 4.

More precisely, FIGS. 5 and 6 respectively represent the common mode gain (parameter Scc21) and the differential mode gain (parameter Sdd21) in dB, as a function of the frequency f in Hz, of an embodiment in which the inductive elements are made of planar windings in superposed (stacked) conductive levels. The representations of FIGS. 5 and 6 are, in frequency, in logarithmic scale from 100 MHz to 8 GHz. In the example shown in FIGS. 5 and 6, we assume a filter sized to filter (reject) the frequency bands around the frequencies of approximately 2.4 GHz and of approximately 5.1 GHz.

As shown in FIG. 5, the coupling between filters 4 and 5 results in two attenuation peaks that can be adjusted, particularly depending on the size of the inductive windings, to approximately 2.4 GHz (gain of approximately −36 dB) and to approximately 5.1 GHz (gain of approximately −25 dB). In addition, the attenuation in bands of a few hundred MHz around these peaks is sufficient (gain lower than −20 dB) and is significantly better than in the example shown in FIG. 3 for the band around 5.1 GHz.

As shown in FIG. 6, the differential mode attenuation remains less than 3 dB (gain greater than −3 dB) for the entire frequency range up to more than 6 GHz. Therefore, the association in series of the elementary filters and the magnetic coupling between the elements in series does not interfere with the filter's response in differential mode.

Figure 7:
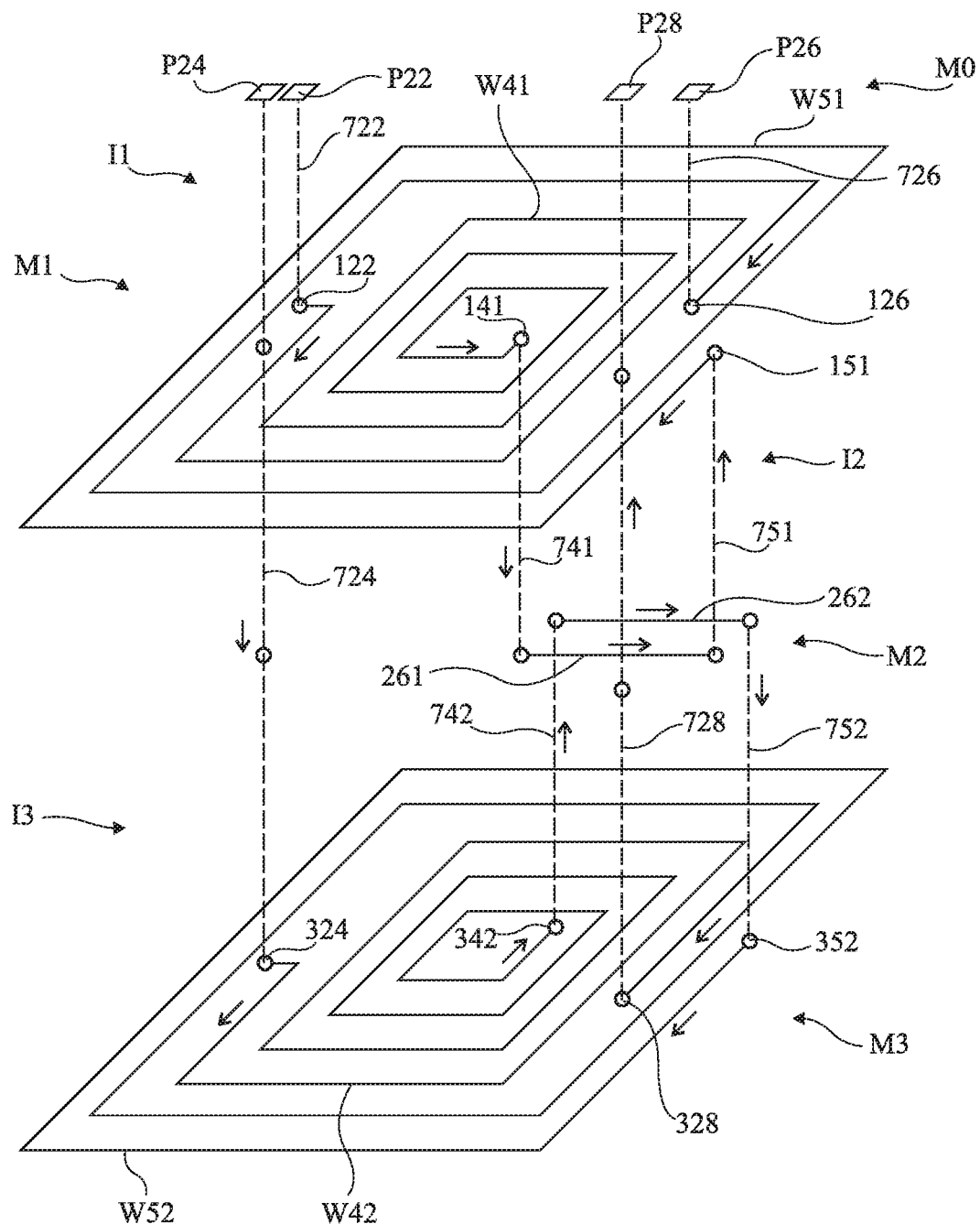
FIG. 7 is a schematic perspective view of an embodiment of the common-mode filter of FIG. 4.
Figure 8:
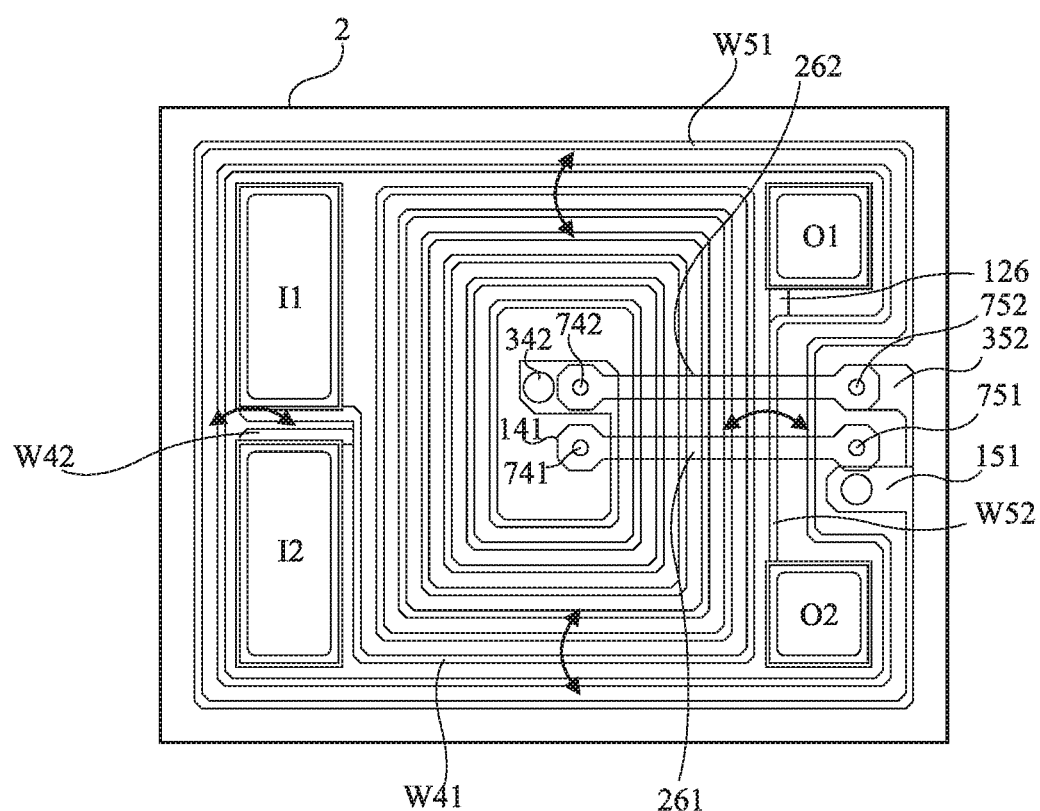
FIG. 8 is a top view of an embodiment of a common-mode filter, formed in an integrated circuit.

The frequency responses of FIGS. 5 and 6 correspond to the responses of a common-mode filter as shown in FIGS. 7 and 8.

FIG. 7 is a schematic perspective view of an embodiment of the common-mode filter of FIG. 4; and FIG. 8 is a top view of an embodiment of a common-mode filter, formed in an integrated circuit.

In the example of FIGS. 7 and 8, we suppose a common mode filter in which the inductive elements are made of conductive tracks in the form of planar windings in an integrated circuit or in a multilevel printed circuit. We suppose that the planar windings are made of straight segments in conductive levels M0, M1, M2 and M3, separated one from the other by insulating levels I1, I2 and I3. However, circular or variously shaped tracks may also be provided.

Inductive element 41 consists of a planar winding W41 in conductive level M1. Winding W41 is made of conductive tracks. Winding W41 rotates, from outside to inside, counterclockwise from a terminal 122 to a terminal 141, terminal 141 being closer to the center of the structure than terminal 122.

Inductive element 51, electrically in series with element 41, consists of a conductive planar winding W51 in level M1, coplanar and around winding W41. Winding W51 is made of conductive tracks. Winding W51 rotates, from outside to inside, clockwise from a terminal 151 to a terminal 126, terminal 126 being closer to the center of the structure than terminal 151 but outside winding W41.

Interconnection 61 between windings W41 and W51 (between terminals 141 and 151) is made by a track 261 in conductive level M2, for example under level M1. Conductive vias 741 and 751 connect terminals 141 and 151 to track 261 through insulating level I2 between conductive levels M1 and M2.

Inductive element 42 consists of a planar winding W42 in conductive level M3, for example under level M2. Winding W42 rotates, from outside to inside, counterclockwise from a terminal 324 to a terminal 342, terminal 342 being closer to the center of the structure than terminal 324.

Inductive element 52, electrically in series with element 42, consists of a conductive planar winding W52 in level M3, coplanar and around winding W42. Winding W52 is made of conductive tracks. Winding W52 rotates, from outside to inside, clockwise from a terminal 352 to terminal 128, terminal 128 being closer to the center of the structure than terminal 352 but outside winding W42.

Interconnection 62 between windings W42 and W52 (between terminals 342 and 352) is made by a track 262 in level M2, in this example between levels M1 and M3. Conductive vias 742 and 752 connect terminals 342 and 352 to track 262 through insulating level I3 between conductive levels M2 and M3.

Windings W41 and W42 are superimposed and separated by insulating level I2. Their conductive tracks are superimposed (except at the ends of the windings to allow the connection to other elements). Thus, for a current circulating in the same direction in both windings, coupling coefficient k4 between windings 41 and 42 is positive.

Similarly, windings W51 and W52 are superimposed and separated by insulating level I3. Their conductive tracks are superimposed (except at the ends of the windings to allow the connection to other elements). Thus, for a current circulating in the same direction in both windings, coupling coefficient k5 between windings 51 and 52 is positive.

In the example shown in FIGS. 7 and 8, conductive pads P22, P24, P26 and P28, formed in a conductive level M0 above level M1, respectively at the vertical of terminals 122, 324, 126 and 328, are connected by vias 722, 724, 726 and 728 to these terminals 122, 324, 126 and 328. Vias 722 and 726 go through an insulating level I1 between levels M0 and M1. Vias 724 and 728 go through insulating levels I1, I2 and I3.

Pads P22, P24, P26, and P28 define terminals 22 (I1), 24 (I2), 26 (O1), and 28 (O2), respectively.

One can therefore see that, in clockwise direction, winding W41 rotates, from inside to outside, while winding W51 rotates from outside to inside. Thus, a current flowing from pad P22 to pad P26 will circulate (directions indicated by arrows in FIG. 7) counterclockwise in winding W41 and clockwise in winding W51. The coupling coefficient k1 between windings W41 and W51 is therefore negative.

Moreover, in clockwise direction, winding W42 rotates, from inside to outside, while winding W51 rotates from outside to inside. Thus, a current flowing from pad P24 to pad P28 will circulate (directions indicated by arrows in FIG. 7) counterclockwise in winding W42 and clockwise in winding W52. The coupling coefficient k2 between windings W42 and W52 is therefore negative.

An advantage of making these tracks in an intermediate level (M2), between the levels (M1 and M3) in which the inductive windings are formed, is that it balances the electrical paths between the two channels (inductors 41-51 and inductors 42-52) of the filter.

Where appropriate, levels M0, M1, M2 and M3 are not four successive levels, but other conductive levels may be present between the levels used for the windings and their interconnections. In addition, the level (M2) in which tracks 261 and 262 are formed could be below the level M3.

According to an alternative embodiment, both inductors, negatively magnetically coupled and electrically in series, are formed in two different conductive levels and are stacked in the form of the two concentric windings, for example, in the level M1 for windings W41 and W52 (inductors 41 and 52) and in the level M3 for the windings W42 and W51 (inductors 42 and 51). This does not change the operating principle but has the advantage of better balancing the serial resistances of the two lines (channels) if the thicknesses of the levels M1 and M3 are not identical.

In an integrated circuit, the conductive levels in which is made filter 2 can be metallization levels overlying a semiconductor substrate (not shown) in which are formed diodes (D1, D2, FIG. 4) of protection circuits against electrostatic discharge. It is sufficient to extend via 724 under terminal 24 and to form a via under terminal 22 to cathode contacts of diodes formed by PN junctions in the substrate. It is possible to do the same on the side of terminals 26 and 28 by extending via 728 under terminal 28 and forming a via under terminal 26.

FIG. 8 is a top view of the structure in FIG. 7. Therefore, all items in FIG. 7 are not visible in FIG. 8.

In the example in FIG. 8, windings W41 and W42 have a greater number of turns and are longer than windings W51 and W52 as they are sized to filter the low frequency (with respect to the other rejection frequency). Windings W51 and W52 are sized to filter the high frequency (with respect to the other rejection frequency). Typically, one begins by sizing the windings for frequencies above the respective target frequencies to take into account the fact that the negative coupling with the other winding of the same track will reduce the common mode resonance frequency.

As a specific example, a filter as shown in FIG. 8 can be made with respective inductance values of approximately 18 nanoHenrys for elements 41 and 42 and of approximately 5 nanoHenrys for elements 51 and 52, with coupling coefficients k4 and k5 of approximately 0.8 and 0.65 and coupling coefficients k1 and k2 of approximately −0.3.

The trimming of the common mode resonance frequencies is obtained, among others, by modifying:
the distance in the plane between the turns of the windings, which modifies the capacitance between the turns;
the length of the conductive tracks;
the distance between windings W41 and W51, respectively between windings W42 and W52.

The coupling coefficients k1, k2, k4 and k5 depend on the embodiments and on the rejection frequencies of elementary filters 4 and 5. Coefficients k1 and k2 are preferably equal. We assume that, in the described embodiments, the coupling coefficients, whether positive or negative, are not negligible, i.e. are, in absolute value, comprised between approximately 0.1 and 1.

To implement a filter with more than two rejection frequencies, in a structure as shown in FIGS. 7 and 8, one or more additional windings (depending on the number of rejection frequencies) concentric and coplanar are provided around windings W41 and W51, respectively W42 and W52. Preferably, the windings go, from inside to outside, in the same conductive level following the order of the increasing frequencies. However, the directions of the current in two neighboring coplanar windings are inverted to provide a negative magnetic coupling from one inductive element to the adjacent inductive element electrically in series.

One advantage of the described embodiments is that they allow a multi-band common-mode filter.

An advantage of the described embodiments is that the implementation of the multi-band filter is compatible with usual techniques of manufacturing of common-mode filters in planar technology.

An advantage of the described embodiments is that the implementation of the filter, thanks to the coupling in the plane between the windings of the same channel, optimizes the size of the filter.

An advantage of the described embodiments is that they allow the implementation of common-mode filters adapted to radio frequency applications, for example adapted to the frequencies of 700 MHz (LTE), 800 to 900 MHz (GSM), 1.5 GHz (GPS), 2.4 and 5.1 GHz (WiFi), etc.

Different embodiments with various alternatives have been described. Various variations and modifications will occur to those skilled in the art. It should be noted that those skilled in the art may combine various elements of these various embodiments and alternatives. Further, the values to be given to the different elements depend on the application and on the attenuation bands desired for the common mode. Moreover, the practical implementation of the described embodiments is within the abilities of those skilled in the art based on the functional indications given hereabove. In practice, the determination of the values to be given to inductive elements and to the coupling coefficients can be done using simulation tools commonly used in microelectronics.

The invention claimed is:

1. A circuit, comprising at least two common-mode filters electrically in series and magnetically coupled, wherein said at least two common-mode filters comprise:
at least one first inductive element and at least one second inductive element formed by planar conductive windings that are electrically in series;
wherein the planar conductive windings electrically in series of the at least one first inductive element and at least one second inductive element are concentric; and
at least one third inductive element and at least one fourth inductive element formed by planar conductive windings that are electrically in series;

wherein the planar conductive windings electrically in series of the at least one third inductive element and at least one fourth inductive element are concentric.

2. The circuit of claim 1, wherein the magnetic coupling between two electrically neighboring common-mode filters of the at least two common-mode filters is negative.

3. The circuit of claim 1, wherein each common-mode filter comprises two inductive elements that are magnetically coupled.

4. The circuit of claim 3, wherein the magnetic coupling between the two inductive elements of the same common-mode filter is positive.

5. The circuit of claim 1, wherein:
the at least one first inductive element and the at least one third inductive element are electrically insulated one from each other and magnetically coupled to each other by being concentric; and
the at least one second inductive element and the at least one fourth inductive element are electrically insulated one from each other and magnetically coupled to each other by being concentric.

6. The circuit of claim 1, wherein respective phase points of the at least one first inductive element, the at least one second inductive element, the at least one third inductive element, and the at least one fourth inductive element are oriented on a same side.

7. The circuit of claim 1, wherein the at least one first inductive element and the at least one third inductive element have approximately a same inductance value.

8. The circuit of claim 1, wherein the at least one second inductive element and the at least one fourth inductive element have approximately a same inductance value.

9. The circuit of claim 1, wherein input terminals and/or output terminals of the circuit are connected to diodes that are grounded.

10. The circuit of claim 1, wherein the planar conductive windings of the at least one first inductive element and the at least one second inductive element are in the same plane.

11. The circuit of claim 10, wherein a rotation direction for current flow of the planar conductive windings in the same plane are inverted.

12. The circuit of claim 1, wherein the planar conductive windings of the at least one first inductive element and the at least one second inductive element are in two overlapping planes.

13. The circuit of claim 1, wherein a first planar conductive winding and a third planar conductive winding, respectively forming the at least one first inductive element and the at least one third inductive element, are made in conductive levels stacked with at least one insulating level.

14. The circuit of claim 13, wherein the first planar conductive winding and the third planar conductive winding are vertically aligned one to the other.

15. The circuit of claim 13, wherein a second planar conductive winding and a fourth planar conductive winding, respectively forming the at least one second inductive element and the at least one fourth inductive element, are vertically aligned one to the other.

16. A common mode filter, comprising:
a first input node;
a second input node;
a first output node;
a second output node;
a first intermediate node;
a second intermediate node;
a first spiral inductor that winds in a first direction and is coupled between the first input node and the first intermediate node;
a second spiral inductor that winds in the first direction and is coupled between the second input node and the second intermediate node;
a third spiral inductor that winds in a second direction opposite the first direction and is coupled between the first intermediate node and the first output node; and
a fourth spiral inductor that winds in the second direction and is coupled between the second intermediate node and the second output node;
wherein the first and third spiral inductors are coplanar and concentric; and
wherein the second and fourth spiral inductors are coplanar and concentric.

17. The circuit of claim 16, wherein the first and second input nodes and/or the first and second output nodes are connected to diodes that are grounded.

18. The common mode filter of claim 16, wherein the first through fourth spiral inductors are concentric.

19. The common mode filter of claim 16, wherein the first and second spiral inductors are positively magnetically coupled and wherein the third and fourth spiral inductors are positively magnetically coupled.

20. The common mode filter of claim 19, wherein the first and third spiral inductors are negatively magnetically coupled and wherein the second and fourth spiral inductors are negatively magnetically coupled.

21. A circuit, comprising:
a first common-mode filter formed by planar conductive windings; and
a second common-mode filter formed by planar conductive windings;
wherein the planar conductive windings of the first and second common-mode filters are electrically connected in series; and
wherein the planar conductive windings that are electrically connected in series are concentric and in a same plane.

22. The circuit of claim 21, wherein the first and second common-mode filters have a negative magnetic coupling.

23. The circuit of claim 21, wherein the planar conductive windings of each of the first and second common-mode filters are magnetically coupled.

24. The circuit of claim 23, wherein the magnetic coupling between the planar conductive windings of each of the first and second common-mode filters is positive.

25. The circuit of claim 21, wherein rotation directions for current flow of the planar conductive windings that are electrically connected in series and in the same plane are inverted.

26. The circuit of claim 21, wherein input terminals and/or output terminals of the circuit are connected to diodes that are grounded.

27. The circuit of claim 21, wherein all of the planar conductive windings of the first and second common-mode filters are concentric.

28. A circuit, comprising:
a first common-mode filter formed by planar conductive windings; and
a second common-mode filter formed by planar conductive windings;
wherein the planar conductive windings of the first and second common-mode filters are electrically connected in series; and wherein the planar conductive windings that are electrically connected in series are concentric and in two overlapping planes.

29. The circuit of claim 28, wherein the first and second common-mode filters have a negative magnetic coupling.

30. The circuit of claim 28, wherein the planar conductive windings of each of the first and second common-mode filters are magnetically coupled.

31. The circuit of claim 30, wherein the magnetic coupling between the planar conductive windings of each of the first and second common-mode filters is positive.

32. The circuit of claim 28, wherein input terminals and/or output terminals of the circuit are connected to diodes that are grounded.

33. The circuit of claim 28, wherein rotation directions for current flow of planar conductive windings that are in a same plane are inverted.

34. The circuit of claim 28, wherein all of the planar conductive windings of the first and second common-mode filters are concentric.

* * * * *